(12) United States Patent
Zhu et al.

(10) Patent No.: US 9,240,351 B2
(45) Date of Patent: Jan. 19, 2016

(54) FIELD EFFECT TRANSISTOR DEVICE WITH IMPROVED CARRIER MOBILITY AND METHOD OF MANUFACTURING THE SAME

(75) Inventors: Huilong Zhu, Poukeepsie, NY (US); Zhijiong Luo, Poukeepsie, NY (US); Haizhou Yin, Poukeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 289 days.

(21) Appl. No.: 13/063,731

(22) PCT Filed: Jun. 22, 2010

(86) PCT No.: PCT/CN2010/074234
§ 371 (c)(1),
(2), (4) Date: Mar. 11, 2011

(87) PCT Pub. No.: WO2011/079586
PCT Pub. Date: Jul. 7, 2011

(65) Prior Publication Data
US 2011/0260258 A1    Oct. 27, 2011

(30) Foreign Application Priority Data
Dec. 31, 2009    (CN) .......................... 2009 1 0244632

(51) Int. Cl.
*H01L 21/70*    (2006.01)
*H01L 21/8238*    (2006.01)
*H01L 29/78*    (2006.01)

(52) U.S. Cl.
CPC ...... *H01L 21/823807* (2013.01); *H01L 21/823842* (2013.01); *H01L 21/823857* (2013.01); *H01L 29/7845* (2013.01)

(58) Field of Classification Search
CPC .................................................. H01L 29/7845
USPC ......................................... 257/369, E27.062
See application file for complete search history.

(56) References Cited

U.S. PATENT DOCUMENTS

| 2004/0113217 | A1 | 6/2004 | Chidambarrao et al. | |
| 2006/0071285 | A1* | 4/2006 | Datta et al. | 257/407 |
| 2006/0124974 | A1 | 6/2006 | Cabral et al. | |
| 2006/0160317 | A1 | 7/2006 | Zhu | |
| 2009/0134470 | A1* | 5/2009 | Yang | 257/369 |
| 2009/0283833 | A1* | 11/2009 | Bach | 257/368 |

FOREIGN PATENT DOCUMENTS

| CN | 1532912 | 9/2004 |
| CN | 1790715 A | 6/2006 |

* cited by examiner

*Primary Examiner* — Hsin-Yi Hsieh
(74) *Attorney, Agent, or Firm* — Troutman Sanders LLP

(57) ABSTRACT

The devices are manufactured by replacement gate process and replacement sidewall spacer process, and both tensile stress in the channel region of NMOS device and compressive stress in the channel region of PMOS device are increased by forming a first stress layer with compressive stress in the space within the first metal gate layer of NMOS and a second stress layer with tensile stress in the space within the second metal gate layer of PMOS, respectively. After formation of the stress layers, sidewall spacers of the gate stacks of PMOS and NMOS devices are removed so as to release stress in the channel regions. In particular, stress structure with opposite stress may be formed on sidewalls of the gate stacks of the NMOS device and PMOS device and on a portion of the source region and the drain region, in order to further increase both tensile stress of the NMOS device and compressive stress of the PMOS device.

33 Claims, 13 Drawing Sheets

FIELD EFFECT TRANSISTOR DEVICE WITH IMPROVED CARRIER MOBILITY AND METHOD OF MANUFACTURING THE SAME

BENEFIT CLAIMS

This application is a US National Stage of International Application No. PCT/CN2010/074234, filed Jun. 22, 2010, which claims the benefit of CN 200910244632.1, filed Dec. 31, 2009.

FIELD OF THE INVENTION

The present invention generally relates to improving the device performance of a field effect transistor by strain engineering and, and more specifically, to improving carrier mobility by introducing stress changes to the channel region.

BACKGROUND OF THE INVENTION

With the development of the semiconductor technology, integrated circuits with higher performance and more powerful functions require greater element density. Thus, the sizes of the components need to be scaled further.

However, with the continuous reduction of the sizes of the integrated circuit, the constant material properties and physical effects for the operation of the transistor and other elements are inevitably impaired. Accordingly, in order to maintain the performance of the components, many new innovations in the design of transistors have been worked out.

The carrier mobility is a critical factor to maintain the performance of field effect transistors. When an voltage is applied to the gate isolated from the channel by a very thin gate dielectric, there are some negative influences on the current or charge flowing in the channel of the doped semiconductor caused by the carrier mobility.

It is known that the mechanical stress in the channel region of the FET may, depending on the type of carriers and the direction of the stress, significantly increase or reduce the carrier mobility. In the FET with channels usually formed along 110 orientation, the tensile stress along the direction of the source/drain region may improve the mobility of electrons while reducing the mobility of holes, which may advantageously improve the performance of the NMOS. The compressive stress along the direction of the source/drain region may improve the mobility of holes while reducing the mobility of electrons, which may advantageously improve the performance of the PMOS. A large amount of structures and materials have already been proposed in the prior art to generate tensile stress or compressive stress in semiconductor materials. For example, US2006/0160317 has already proposed a solution for improving the carrier mobility in the channel by depositing a stress layer on a MOSFET device, and then selectively etching the entire or partial gate layer.

However, the carrier mobility is typically changed by the stress layer or stress interface in prior art, which is disadvantageous to continuously reduce the size of the device and may lead to a complicated manufacturing process. Moreover, with the reduction of the size of the semiconductor device currently, the corresponding channel region is decreased accordingly. As a result, for the stress material applied to the source and/or drain regions on both sides of the channel region, when the stress material expands, the corresponding increase of the stress is very limited, which may not advantageously improve the performance of the MOSFET transistor (e.g. on-off current ratio). As a result, the COMS circuit formed by the above-mentioned method has a poor performance. Therefore, it requires a new method for manufacturing the semiconductor device, which may advantageously improve the carrier mobility at the channel region of the NMOS and/or PMOS device, and at the same time reduce the size of the device and simplify the manufacturing process.

SUMMARY OF THE INVENTION

In view of the above-mentioned problems, the present invention provides a replacement-gate field effect transistor device with improved carrier mobility, which comprises: a semiconductor substrate with a NMOS region and a PMOS region, wherein the NMOS region and the PMOS region are isolated from each other; a first gate stack formed on the NMOS region and a second gate stack formed on the PMOS region, wherein the first gate stack comprises: a first gate dielectric layer; a first metal gate layer and a first stress layer with compressive stress on the first gate dielectric layer, wherein the first stress layer fills the space within the first metal gate layer; and the second gate stack comprises: a second gate dielectric layer; a second metal gate layer and a second stress layer with tensile stress on the second gate dielectric layer, wherein the second stress layer fills the space within the second metal gate layer; a third stress structure with tensile stress on the sidewall of the first gate stack; and a fourth stress structure with compressive stress on the sidewall of the second gate stack.

Besides, the present invention also provides a replacement-gate N-type field effect transistor device with improved carrier mobility, which comprises: a semiconductor substrate; a source region and a drain region formed in the semiconductor substrate; an interlayer dielectric layer located on the semiconductor substrate, and an truncation formed in the interlayer dielectric layer; a gate stack formed within the truncation, wherein the gate stack comprises: a gate dielectric layer; a metal gate layer and a stress layer with compressive stress disposed on the gate dielectric layer, wherein the stress layer fills the space within the metal gate layer; a stress structure with tensile stress disposed on the sidewall of the gate stack. The present invention also provided a replacement-gate P-type field effect transistor device with improved carrier mobility, which comprises: a semiconductor substrate; a source region and a drain region within the semiconductor substrate; an interlayer dielectric layer on the semiconductor layer and an truncation formed in the interlayer dielectric layer; a gate stack formed within the truncation, wherein the gate stack comprises: a gate dielectric layer; a metal gate layer and a stress layer with tensile stress on the gate dielectric layer, wherein the stress layer fills the space within the metal gate layer; a stress structure with compressive stress disposed on the sidewall of the gate stack.

In accordance with another aspect of the present invention, a method of manufacturing a gate-last field effect transistor device with improved carrier mobility, which comprises following steps: a) providing a semiconductor substrate with a NMOS region and a PMOS region; b) forming a first interface layer, a first dummy gate layer and a first gate stack sidewall spacer belonging to the NMOS region on the semiconductor substrate, and a second interface layer, a second dummy gate layer and a second gate stack sidewall spacer belonging to the PMOS region on the semiconductor substrate; and forming source regions and drain regions respectively belonging to the NMOS region and the PMOS region, and an interlayer dielectric layer covering the device in the semiconductor substrate; c) removing the second dummy gate layer of the PMOS region to form a second truncation, so as to form a second gate stack in the second truncation, wherein the second gate stack comprises a second gate dielectric layer, a second metal gate layer and a second stress layer filling the space within the second metal gate layer, the sidewall of the second truncation and the second interface layer are covered by the second gate dielectric layer and the second metal gate layer, and the second stress layer is made of a stress material with tensile stress; d) removing the first dummy gate layer of the NMOS region to form a first truncation, so as to form a first gate stack in the first truncation, wherein the first gate stack comprises a first gate dielectric layer, a first metal gate layer, and a first stress layer which fills the space within the first metal gate layer, the sidewall of the first truncation and the first interface layer are covered by the first gate dielectric layer and the first metal gate layer, and the first stress layer is made of a stress material with compressive stress; e) removing the first gate stack sidewall spacer to increase tensile stress in the channel region of the NMOS region, and removing the second gate stack sidewall spacer to increase compressive stress in the channel region of the PMOS region; f) forming a third stress structure with tensile stress on the sidewall of the first gate stack of the NMOS region, and forming a fourth stress structure with compressive stress on the sidewall of the second gate stack of the PMOS region.

Additionally, the present invention further proposes a method of manufacturing a gate-last N-type field effect transistor device with improved carrier mobility, which comprises: a) providing a semiconductor substrate; b) forming an interface layer, a dummy gate layer and a gate stack sidewall spacer on the semiconductor substrate, and forming a source region and a drain region, and an interlayer dielectric layer covering the device in the semiconductor substrate; c) removing the dummy gate layer to form an truncation, so as to form a gate stack in the truncation, wherein the gate stack comprises a gate dielectric layer, a metal gate layer and a stress layer filling the space within the metal gate layer, and the stress layer is made of a stress material with compressive stress; d) removing the gate stack sidewall spacer to increase the tensile stress in the channel region of the device; and e) forming a stress structure with tensile stress on the sidewall of the gate stack.

The present invention further proposes a method for manufacturing a gate-last P-type field effect transistor device with improved carrier mobility, which comprises: a) providing a semiconductor substrate; b) forming an interface layer, a dummy gate layer and a gate stack sidewall spacer on the semiconductor substrate, and forming a source region and a drain region, and an interlayer dielectric layer covering the device in the semiconductor substrate; c) removing the dummy gate layer to form an truncation, so as to form a gate stack in the truncation, wherein the gate stack comprises a gate dielectric layer, a metal gate layer, and a stress layer filling the space within the metal gate layer, the sidewall of the truncation and the interface layer are covered by the gate dielectric layer and the metal gate layer, and the stress layer is made of a stress material with tensile stress; d) removing the gate stack sidewall spacer to increase tensile stress in the channel region of the device; e) forming a stress structure with compressive stress on the sidewall of the gate stack.

By devices and the methods of manufacturing the same of the present invention, stress may be applied to the channel of the NMOS device and/or the PMOS device to the maximum extent, which may improve the performance of the devices with the continuous reduction of sizes of the devices.

DETAILED DESCRIPTION OF THE INVENTION

Figure 1:
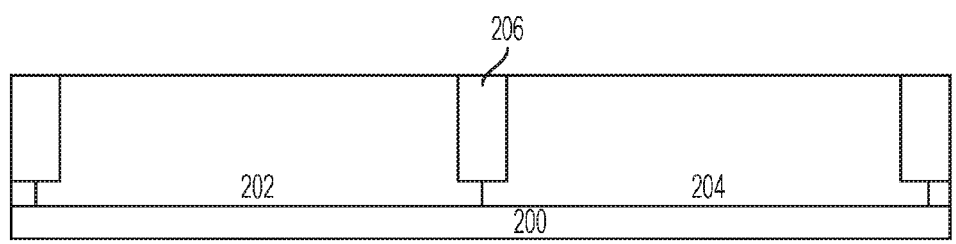
FIGS. 1 to 15 are structural diagrams illustrating the manufacturing of different stages of the field effect transistor device according to an embodiment of the present invention.

The disclosure below provides various embodiments or examples adopted for implementing the different structures of the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purposes of simplification and clearness, and does not denote the relationship between respective embodiments and/or arrangements being discussed. Moreover, the present invention provides various examples for specific process and materials. However, it is obvious for a person having ordinary skill in the art that other process and/or materials may alternatively be utilized. Furthermore, the following structure in which a first object is "on" a second object may comprise an embodiment in which the first object and second object are formed to be in direct contact with each other, and may also comprise an embodiment in which another object is formed between the first object and the second object such that the first and second objects might not be in direct contact with each other. Note that the components illustrated in the drawings may not be drawn to scale. In addition, the description about the well known components and processing techniques are omitted in the present invention for avoiding unnecessary limitation to the present invention.

As stated above, when the channel region is applied tensile stress, the performance of the N-type Metal-Oxide-Semiconductor (NMOS) field effect transistor device will be improved. Whereas when the channel region is applied compressive stress, the performance of the P-type Metal-Oxide-Semiconductor (PMOS) field effect transistor device will be improved. In an embodiment of the present invention, a first stress layer with compressive stress is formed in the space within the first metal gate layer of the NMOS device, and a second stress layer with tensile stress is formed in the space within the second metal gate stack layer of the PMOS device, by replacement gate process, respectively. After the formation of the stress layers, the sidewall spacers of the gate stacks of the PMOS and NMOS devices are removed so as to release stress to the channel regions, and thus the tensile stress in the channel of the NMOS device and the compressive stress in the channel of the PMOS device may be improved. In particular, stress layers with opposite stress may be formed both on the gate stack sidewalls of the NMOS and PMOS devices and over portions of the source and drain regions, in order to further improve tensile stress of the NMOS device and the compressive stress of the PMOS device. Namely, a third stress structure with tensile stress may be formed for the NMOS device, and a fourth stress structure with compressive stress may be formed for the PMOS device. According to the devices and the methods of fabricating the same, the performance of the devices may be enhanced by way of applying stress as large as possible to the channel of the NMOS device and/or the PMOS device, in the case that the size of the devices is continuously scaled.

Figure 15:
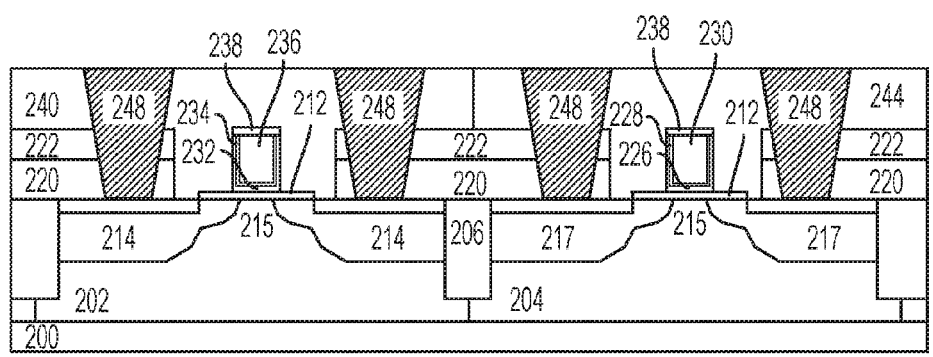

With reference to FIG. 15, FIG. 15 is a diagram illustrating the semiconductor device according to an embodiment of the present invention. The device is manufactured by the replacement gate process and the replacement sidewall spacer process. The so-called replacement gate process comprises: forming a dummy gate, implanting and annealing the source/drain regions of the device so as to activate the dopants of the source/drain regions, removing the dummy gate after the formation of the source and drain regions, and then forming new gate stacks belonging to the NMOS region and the PMOS region respectively. The so-called replacement sidewall spacer process comprises: forming dummy sidewall spacers on the sidewalls of the gate stacks of the NMOS region and the PMOS region, removing the dummy sidewall spacers whenever it is appropriate, and then forming new sidewall spacers according to design require.

The structure of the semiconductor device according to an embodiment of the present invention is described below in detail. The device comprises a semiconductor substrate 200 with an NMOS region 202 and a PMOS region 204, wherein the NMOS region 202 and the PMOS region 204 are isolated from each other by an isolation region 206.

In the present embodiment, the substrate 200 comprises a crystalline silicon substrate (such as a wafer). According to the design specifications known in the prior art (for example, a p-type substrate or an n-type substrate), the substrate 200 may be of various doping configurations. Other examples of the substrate 200 may also comprise other common semiconductor, for example germanium and diamond. Alternatively, the substrate 200 may comprise compound semiconductors, such as SiC, GaAs, InAs or InP. In addition, the substrate 200 may comprise an epitaxial layer, may be applied stress to enhance performance, and/or may comprise a SOI (silicon on insulator) structure.

The isolation region 206 is illustratively provided in the present embodiment. The device with a plurality of isolation regions 206 may be manufactured by periodically repeating the structure provided in the present invention. As noted from the present embodiment, the isolation region 206 is formed by the conventional process in the art, which may comprise, for example, forming a mask on the surface of the device to be formed on the semiconductor substrate 200 by lithography, forming a channel by etching the substrate through an truncation of the mask, and then filling the channel with $SiO_2$ dielectric material, as illustrated in FIG. 1.

The device further comprises the source/drain regions 214 belonging to the NMOS region and the source/drain regions 217 belonging to the PMOS region, and channel regions 215 between the respective source and drain regions. The source/drain regions 214 and 217 may be formed by, depending on the desired transistor structure, implanting n-type or p-type dopants into the substrate 200. The source/drain regions 214 may be n-type doped Si:C, wherein the percentage of C is in the range of 0.2%-2%. The source/drain regions 217 may be p-type doped SiGe, wherein the percentage of Ge is in the range of 20%-70%. The source/drain regions 214 and 217 may be formed by lithography, dopant implantation, diffusion and/or any other appropriate method. In the present invention, the replacement gate process is performed, and thus the source/drain regions 214, 217 are formed prior to the formation of the gate stacks of the NMOS and PMOS regions. The common processes and steps for manufacturing a semiconductor may be utilized for thermal annealing the device so as to activate the dopants in the source and drain regions 214 and 217. The thermal annealing may be performed following the processes comprising rapid thermal annealing and spike annealing, which are known to those skilled in the art.

The device further comprises a first gate stack formed on the NMOS region 202, and a second gate stack formed on the PMOS region 204, wherein the first gate stack comprises: a first gate dielectric layer 232; a first metal gate layer 234 formed on the first gate dielectric layer 232; and a first stress layer 236 with compressive stress, wherein the first stress layer 236 fills the space within the first metal gate layer 234. The second gate stack comprises: a second gate dielectric layer 226; a second metal gate layer 228 formed on the second gate dielectric layer and a second stress layer 230 with tensile stress, wherein the second stress layer 230 fills the space within the second metal gate layer.

The first gate dielectric layer 232 may be a thermal oxide layer comprising silicon oxide, silicon nitride, such as silicon dioxide, and may also be a high-k dielectric, such as $HfO_2$, $TiO_2$, $ZrO_2$, and $La_2O_3$, with a thickness of preferably in the range of about 1 nm-5 nm. The first metal gate layer 234 may be n-type metals, and may comprise, but not limited to, TaC, TiN, TaTbN, TaErN, TaYbN, TaSiN, HfSiN, MoSiN, $RuTa_x$, and $NiTa_x$. Preferably, the work function of the first metal gate layer 234 approaches the edge of the conduction band of Si, for example, with a distance to the edge of the conduction band of Si smaller than 0.2 eV. Preferably, the first metal gate layer 234 may have a thickness in the range of about 1-5 nm. The first stress layer 236 fills the space within the first metal gate layer 234, wherein the first stress layer 236 may comprise materials with compressive stress, such as TiAl, which may be formed by sputtering TiAl.

The second gate dielectric layer 226 may be a thermal oxide layer comprising silicon oxide, silicon nitride, such as silicon dioxide, and also may be a high-k dielectric, such as $HfO_2$, $TiO_2$, $ZrO_2$, $Al_2O_3$, with a thickness of preferably in the range of about 1-5 nm. The second metal gate layer 228 may be p-type metals, and may comprise, but not limited to, $MoN_x$, TiSiN, TiCN, TaAlC, TiAlN, TaN, $PtSi_x$, $Ni_3Si$, Pt, Ru, Ir, Mo, HfRu, $RuO_x$. Preferably, the work function of the metal gate layer 228 approaches the edge of the valence band of Si, for example, with a distance to the edge of thevalence band of Si smaller than 0.2 eV. Preferably, the thickness of the metal gate layer 228 may be in the range of about 1-5 nm. The second stress layer 230 fills the space within the second metal gate layer 228, wherein the second stress layer 230 may comprise materials with tensile stress, such as TiAl, which may be formed by depositing Ti and Al in the space within the second metal gate layer 228, and then performing thermal annealing to the same in the temperature range from about 300 to 500° C. for about 1 to 20 seconds.

Figure 2:
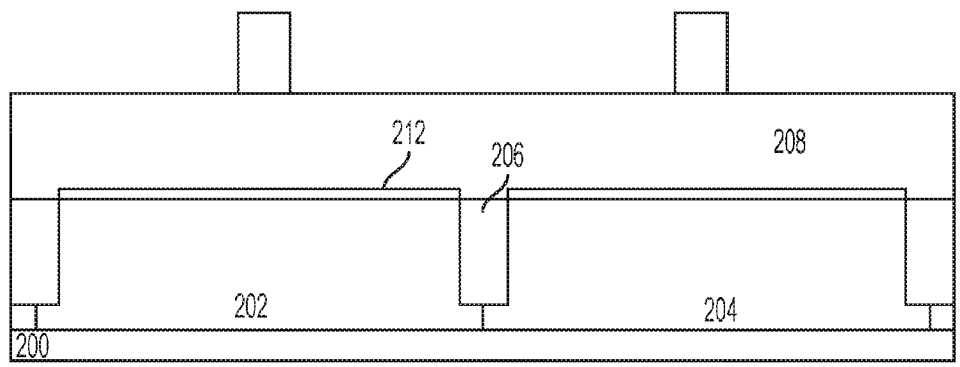
Figure 3:
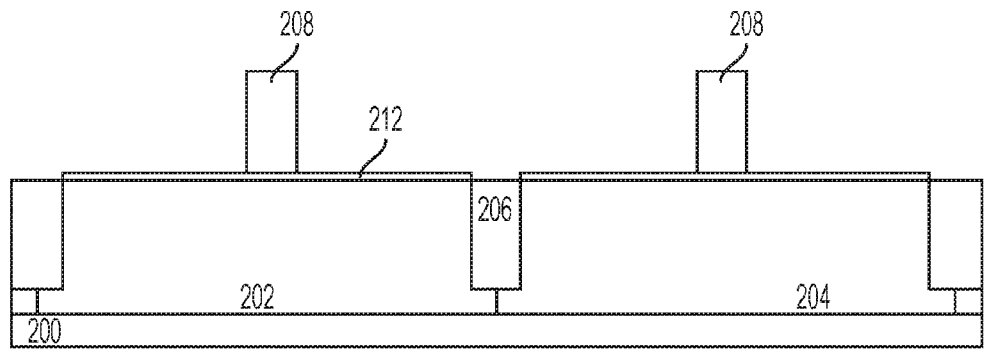
Figure 4:
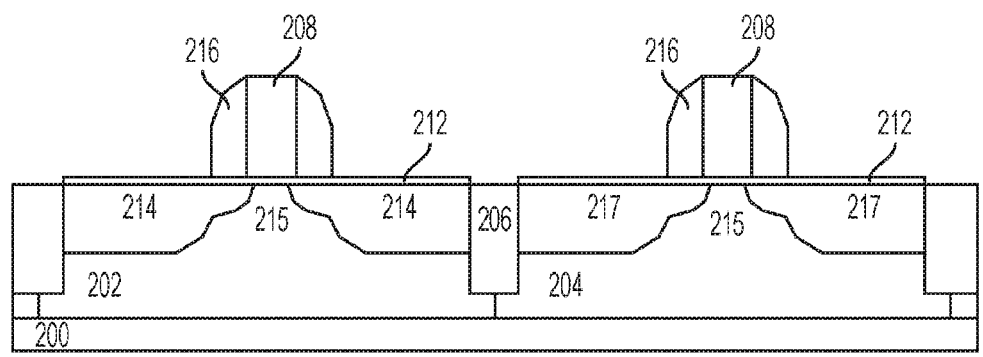
Figure 7:
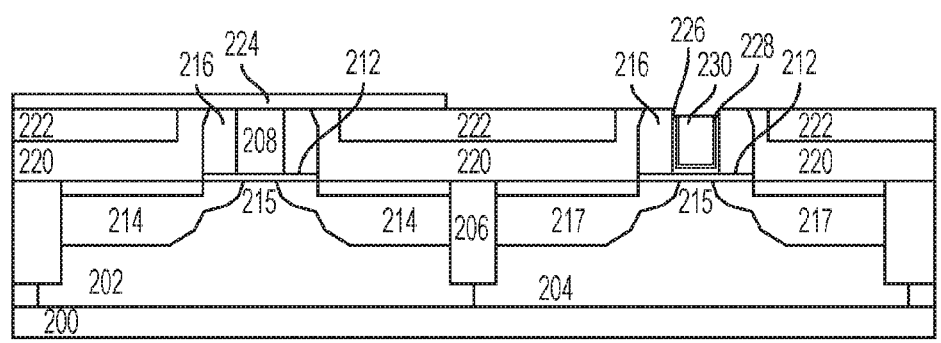
Figure 8:
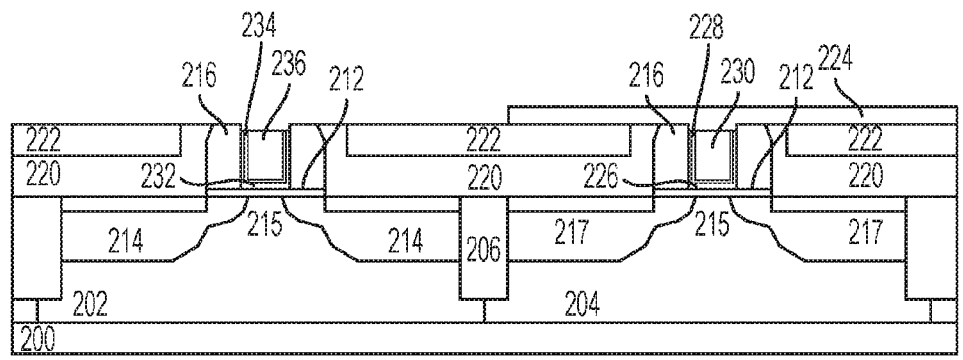

With reference to FIGS. 2-4, the first gate stack is formed by: forming a first dummy gate layer 208 (such as polysilicon) belonging to the NMOS region and a first sidewall spacer 216 (for example, nitride, such as silicon nitride) on the substrate; removing the dummy gate layer 208 to form an truncation; and then forming the first gate dielectric layer 232, the first metal gate layer 234 and the first stress layer 236 in the truncation. Similarly, the second gate stack is formed by: forming a second dummy gate layer 208 and a second sidewall spacer 216 belonging to the PMOS region on the substrate; removing the dummy gate layer 208 to form an truncation; and then forming a second gate dielectric layer 226, a second metal gate layer 228 and a second stress layer 230 in the truncation, as illustrated in FIGS. 7-8.

The first and the second dummy gate layers 208 and the sidewall spacer 216 may be formed by the processes as follows. For example, the first and the second dummy gate layers 208 are formed by depositing interface layers 212 on the substrate in the NMOS region 202 and the PMOS region 204, wherein the interface layers have a thickness in the range of about 1-3 nm. The interface layers may be, for example, oxide layers, such as $SiO_2$. Then dummy gate layers 208 are deposited on the interface layers, such as polysilicon with a thickness in the range of about 50-120 nm. Then etching protection layers are deposited and lithography is performed for the gate to form the first and the second dummy gate layers 208. The first and second sidewall spacer 216 may be formed by depositing nitride layers on the interface layers 212, and then performing reactive ion etching. The interface layers 212 may provide etching protection both to the source and drain regions of the device and the extension regions thereof.

Figure 5:
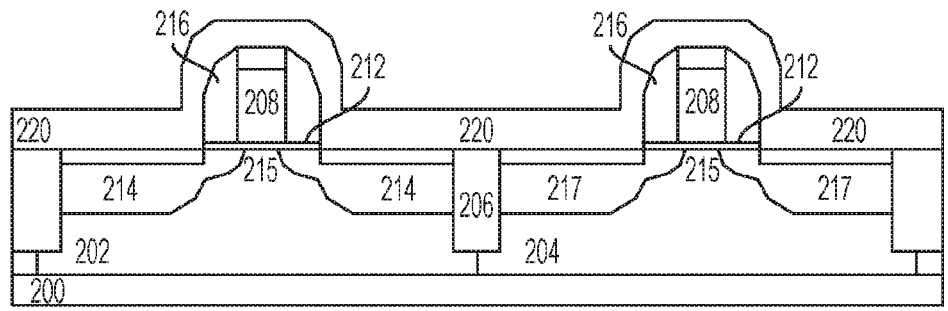
Figure 6:
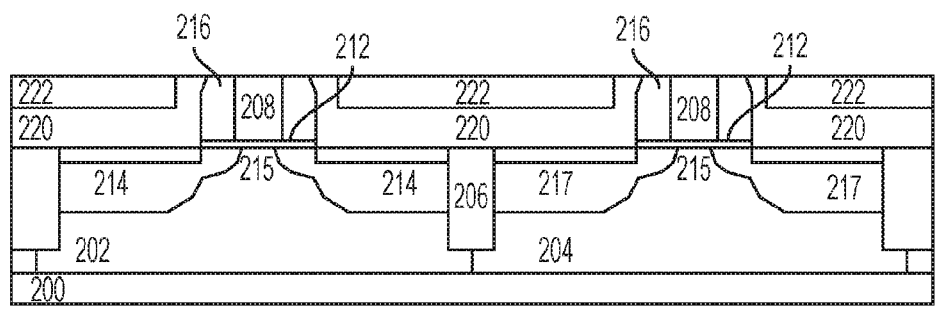

With reference to FIG. 5-6, particularly, the device further comprises interlayer dielectric layers on the substrate and between the first and second gate stacks. The interlayer dielectric comprise a nitride layer 220, wherein the nitride layer 220 has a thickness in the range of about 10-30 nm and an oxide layer 222, and the oxide layer 222 has a thickness in the range of 10-30 nm. The interlayer dielectric layer may be formed by depositing respectively (for example, by Chemical Vapor Deposition (CVD) or Plasma-Enhanced Chemical Vapor Deposition (PECVD)) the nitride layer 220 and the oxide layer 222, and then performing a chemical-mechanical planarization process to expose the upper surfaces of the first dummy gate layer and the second dummy gate layer.

Specifically, the second gate stack may be formed prior to the formation of the first gate stack, so as to avoid degradation of the material and the layer(s) in the first gate stack caused by the thermal annealing process applied to the second stress layer 230. Namely, the NMOS region is protected by the etching protection layer and the PMOS region is exposed. The dummy gate layer 208 of the PMOS region is etched to form an truncation. The second gate dielectric layer 226, the metal gate layer 228 and the stress layer 230 are formed in the truncation, and then thermal annealing is carried out so as to form TiAl with tensile stress. Then, the PMOS region is protected by the etching protection layer and the NMOS region is exposed. The dummy gate layer 208 of the NMOS region is etched to form an truncation. Then, the first gate dielectric layer 232, the metal gate layer 234 and the first stress layer 236 with compressive stress are formed in the truncation.

The device further comprises a third stress structure 240 with tensile stress formed on the sidewall of the first gate stack, and a a fourth stress structure 244 with compressive stress formed on the sidewall of the second gate stack. The third stress structure 240 is made of a material with opposite stress to the first stress layer 236, i.e., a material with tensile stress, for example a tensile-stressed nitride layer, such as $Si_3N_4$. The fourth stress structure 244 is made of a material with opposite stress to the second stress layer 230, i.e., a material with compressive stress, for example, a compressive-stressed nitride layer, such as $Si_3N_4$.

Figure 9:
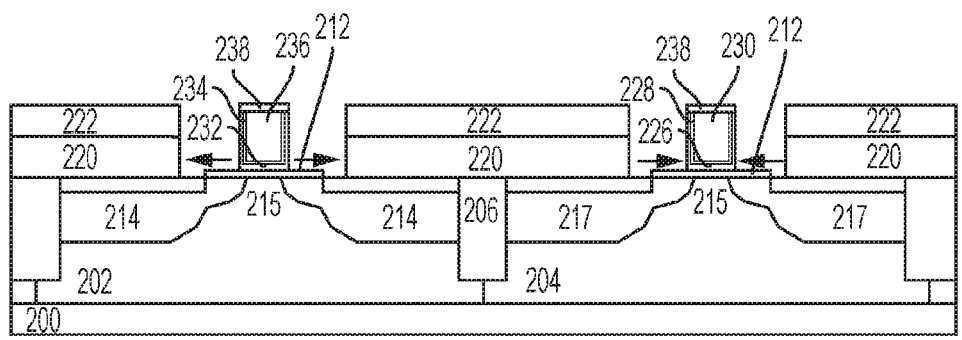

The third stress structure 240 and the fourth stress structure 244 are formed by way of depositing the material with tensile stress and the material with compressive stress respectively on the sidewalls of the first and second gate stacks after removing the first sidewall spacer 216 and the second sidewall spacer 216, as illustrated in FIGS. 9-15. The first sidewall spacer and the second sidewall spacer 216 may be removed by, such as, Reactive Ion Etching (RIE), as shown in FIG. 9. Specifically, prior to the reactive ion etching, an etching protection layer, such as an oxide layer 238, may be deposited on the surfaces of the first and the second gate stacks, so as to protect the first and the second gate stacks.

Since the first gate stack of the NMOS region comprises the first stress layer 236 with compressive stress, such as the TiAl layer, when the first sidewall spacer 216 of the NMOS region is removed, the reaction force applied by the sidewall spacer 216 disappears accordingly, and the TiAl layer with compressive stress is relaxed, such that the tensile stress in the channel region 215 of the NMOS region is increased, resulting in improved electron mobility and enhanced device performance. Likewise, when the second sidewall spacer 216 of the PMOS region is removed, the reaction force applied by the sidewall spacer 216 disappears accordingly, and thus the TiAl layer with tensile stress is relaxed, such that the compressive stress in the channel region 215 of the PMOS region is increased, resulting in improved mobility of the holes and enhanced device performance.

The third stress structure 240 with tensile stress, such as a nitride with tensile stress, is formed on the sidewall of the first gate stack. Specifically, the third stress structure further comprises portions being located above the source and drain regions of the NMOS region and covering the interlayer dielectric layer and the first gate stack. The fourth stress structure 244 with compressive stress, such as a nitride with compressive stress, is formed on the sidewall of the second gate stack. Specifically, the fourth stress structure 244 further comprises portions being located above the source and drain regions of the PMOS region and covering the interlayer dielectric layer and the second gate stack.

Figure 10:
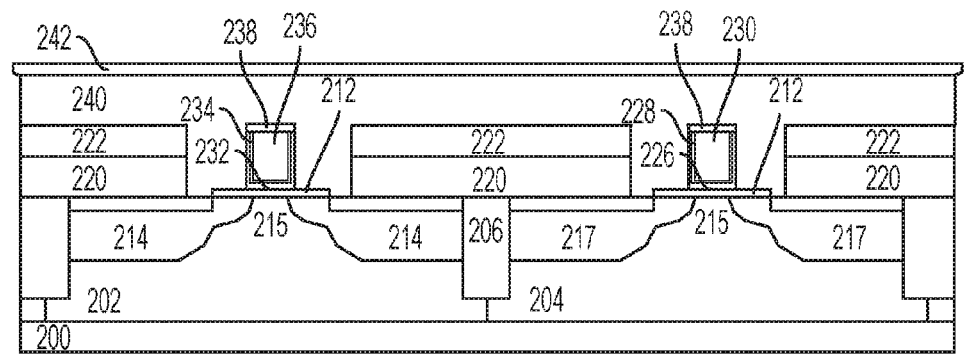
Figure 11:
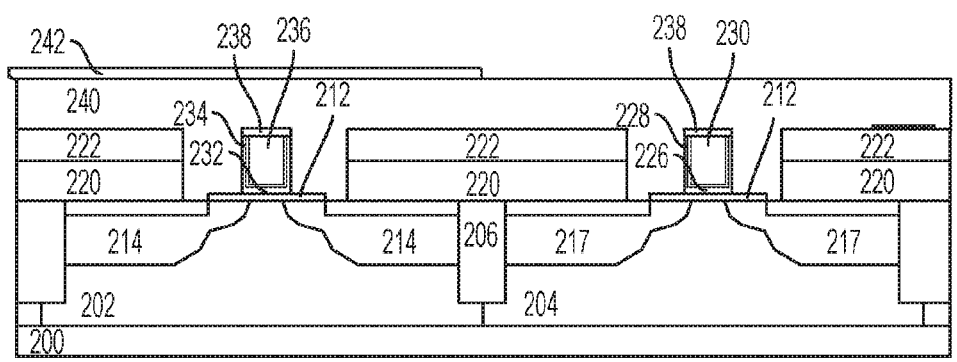
Figure 12:
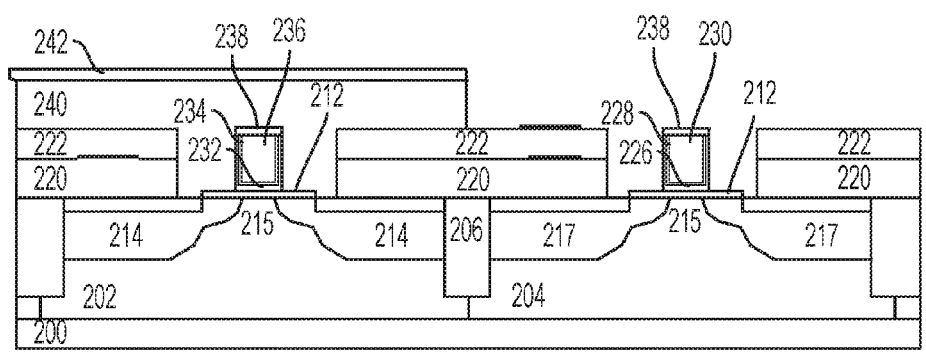

For example, the third and the fourth stress structures 240 and 244 may be formed by the following method. With reference to FIG. 10, the third stress structure 240 with tensile stress having a thickness in the range of about 10-30 nm is deposited on the NMOS region and the PMOS region, wherein the third stress structure covers the entire device, namely, it comprises portions located above the source and drain regions of the NMOS and PMOS regions and covering the interlayer dielectric layer and the upper surfaces of the first and second gate stacks. Then, an etching protection layer 242 having a thickness in the range of about 5-15 nm is deposited on the third stress structure 240, wherein the etching protection layer 242 may be an oxide layer such as silicon oxide. As shown in FIG. 11, lithography is performed so as to form a lithography protection layer on the NMOS region, and then etching such as RIE is performed to remove the etching protection layer 242 on the PMOS region while maintaining the etching protection layer 242 on the NMOS region. The remaining portions of the lithography protection layer on the NMOS region are then removed. As shown in FIG. 12, RIE is carried out to selectively remove portions of the third stress structure 240 which are not covered by the etching protection layer 242, such as the nitride layer with tensile stress.

Figure 13:
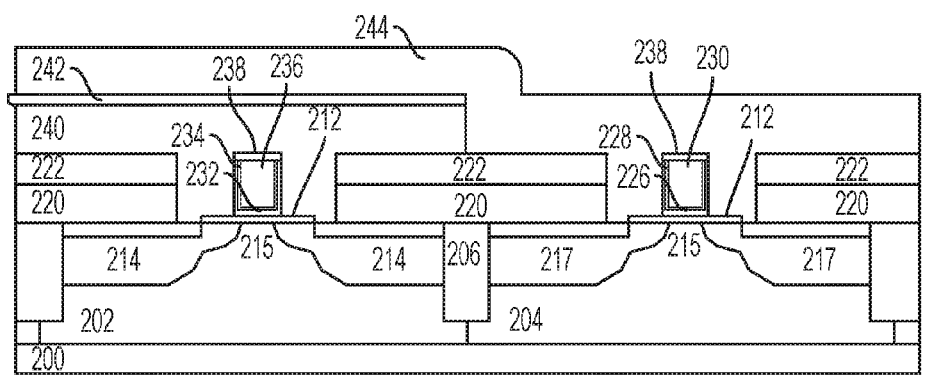
Figure 14:
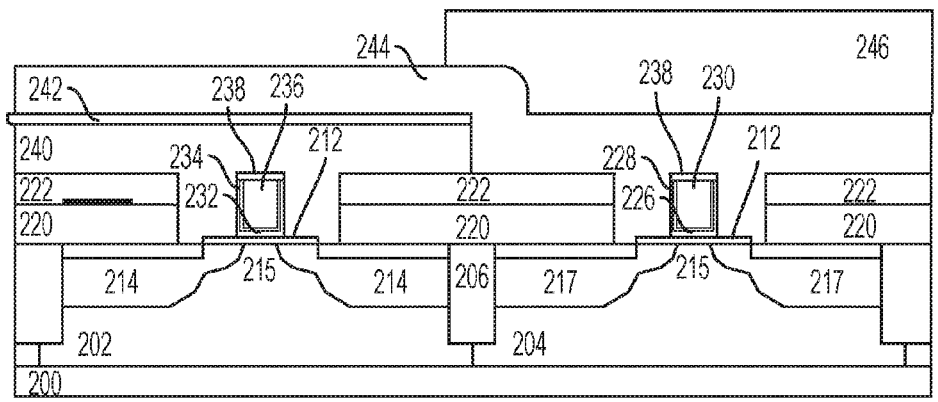

The fourth stress structure 244 may be formed in the same manner as that mentioned above. Namely, the fourth stress structure 244 with compressive stress having a thickness in the range of about 10-30 nm is deposited on the NMOS and PMOS regions. The fourth stress structure covers the entire device, i.e. it comprises portions located above the source and the drain regions of the NMOS and PMOS regions and covering the interlayer dielectric layer and the upper surfaces of the first and second gate stacks, as illustrated in FIG. 13. Then, an etching protection layer 246 having a thickness in the range of about 5-15 nm is deposited on the fourth stress structure 244, wherein the etching protection layer 246 may be an oxide layer such as silicon oxide. Then, lithography is performed so as to form a lithography protection layer on the PMOS region. Then, etching such as RIE is performed to remove the etching protection layer 246 on the NMOS region while maintaining the etching protection layer 246 on the PMOS region, as illustrated in FIG. 14. The remaining portions of the lithography protection layer on the NMOS region are then removed. RIE is carried out to selectively remove the portions of the fourth stress structure 244 which are not covered by the etching protection layer 246, such as the nitride layer with tensile stress.

The third stress structure 240 has the same function as the typical tensile stress cap, and may further increase the tensile stress in the channel region of the NMOS device, so as to improve the mobility of electrons and enhance the performance of the device. Likewise, the fourth stress structure 244 has the same function as the typical compressive stress cap, and may further increase the compressive stress in the channel region of the PMOS device, so as to improve the mobility of holes and enhance the performance of the device.

The chemical-mechanical planarization process (CMP) is performed for planarizing the surface of the semiconductor substrate.

The device may further comprise a contact hole 248 formed in the interlayer dielectric layer on the source regions and the drain regions of the NMOS and PMOS regions. The upper surface of the device may be covered, and lithography is carried out on the source regions and the drain regions of the NMOS and PMOS regions so as to form a lithography protection layer. RIE is performed to form the contact hole 248, which may be provided at the position about 10-50 nm away from the gate stacks of the NMOS and PMOS regions or from the third/fourth sidewall spacer. A TiN layer and a W contact material are formed within the contact hole.

Particularly, a metal silicide, such as NiPtSi or $CoSi_2$, may be formed in the source regions and the drain regions, after the doping and annealing of the source regions and the drain regions of the NMOS and PMOS regions. For example, the metal silicide may be formed by depositing NiPt having a thickness of about 3-12 nm on the substrate, performing thermal annealing at a temperature in the range of about 300-500° C. to the same, and then etching the un-reacted NiPt after the annealing, so as to adjust the contact resistance of the contact hole to be formed subsequently.

The structure of the field effect transistor device formed by the replacement gate process with improved carrier mobility have been described in detail.

Figure 16:
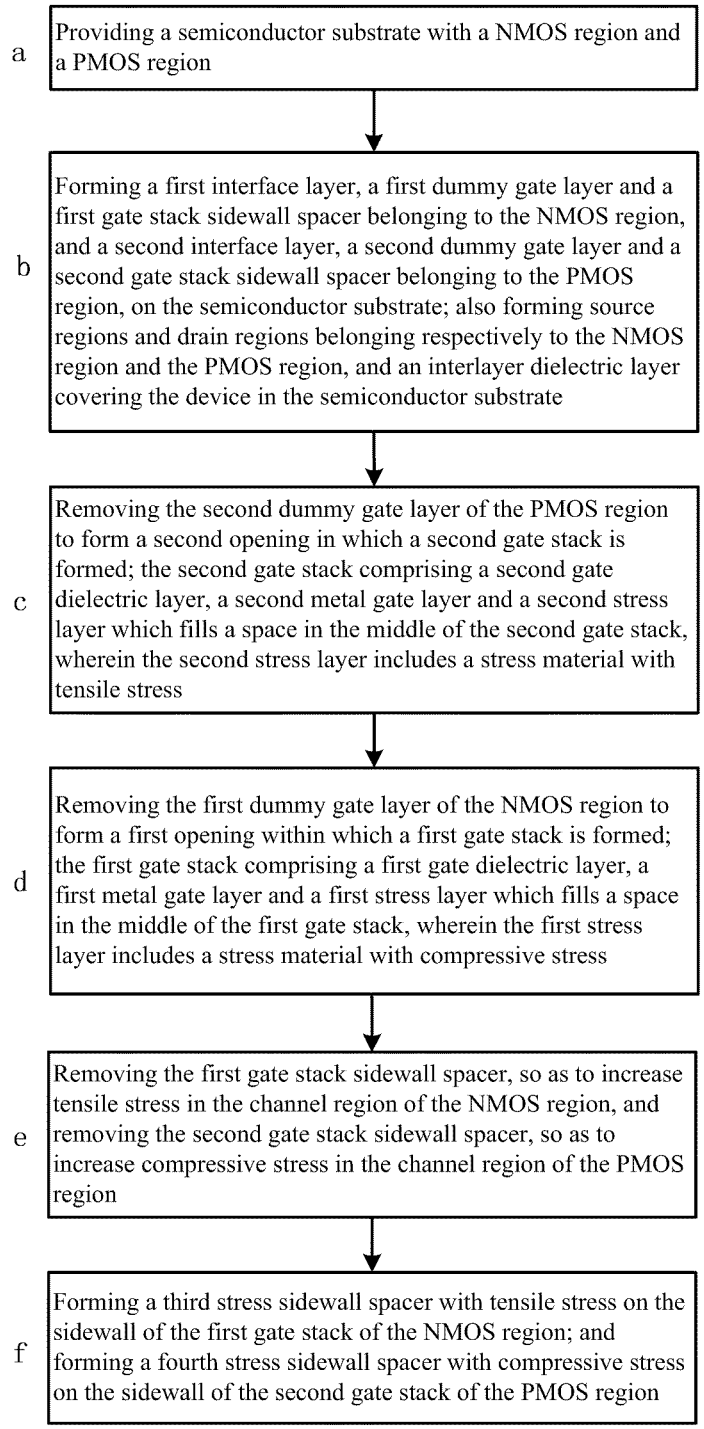
FIG. 16 is a flowchart illustrating the method of manufacturing the field effect transistor according to an embodiment of the present invention.

Hereinafter, with reference to FIG. 16, the method of manufacturing the field effect transistor device of the present invention is described.

In step a, a semiconductor substrate with a NMOS region and a PMOS region is provided.

With reference to FIG. 1, a NMOS region 202 and a PMOS region 204 is formed on the semiconductor substrate 200, wherein the NMOS region 202 and the PMOS region 204 are isolated from each other by an isolation region 206.

In the present embodiment, the substrate 200 comprises a crystalline silicon substrate (for example, a wafer). According to the design specifications known in the prior art (for example, a p-type substrate or an n-type substrate), the substrate 200 may be of various doping configurations. Other examples of the substrate 200 may also comprise other basic semiconductor, for example, germanium and diamond. Alternatively, the substrate 200 may comprise compound semiconductors, such as SiC, GaAs, InAs or InP. Additionally, the substrate 200 may comprise an epitaxial layer, may be manipulated by stress to enhance performance, and/or may comprise a SOI (silicon on insulator) structure.

In the present embodiment, only one isolation region 206 is illustratively provided. However, the device with a plurality of isolation regions 206 may be manufactured by periodically repeating the structure provided in the present invention. As noted from the present embodiment, the isolation region 206 is formed by the conventional process of the art, which may comprise, for example, forming a mask on the surface where a device is to be formed of the semiconductor substrate 200 by lithography, then forming a trench by etching the substrate via an truncation of the mask, and then filling the trench with $SiO_2$ dielectric material.

The flow then goes to step b, a first interface layer 212, a first dummy gate layer 208 and a first gate stack sidewall spacer 216 belonging to the NMOS region 202 and a second interface layer 212, a second dummy gate layer 208 and a second gate stack sidewall spacer 216 belonging to the PMOS region are formed on the semiconductor substrate 200. The source and drain regions 214 belonging to the NMOS region and the source and drain regions 217 belonging to the PMOS region are respectively formed in the semiconductor substrate. A channel region 215 between the source region and the drain region as well as an interlayer dielectric layer covering the whole device are also formed.

With reference to FIG. 2, the first and second interface layers 212, the first and second dummy gate layers 208 and the sidewall spacers 216 may be formed by depositing interface layers 212 having a thickness in the range of about 1-3 nm on the substrate surfaces of the NMOS region 202 and the PMOS region 204, the interface layers may be, for example, an oxide layer such as $SiO_2$. The interface layers 212 may provide etching protection both to the source and drain of the device and the extension regions thereof in subsequent process. Then, dummy gate layers 208, such as polysilicon with a thickness in the range of about 50-120 nm, are deposited on the interface layers, then etching protection layers are deposited, and then gate lithography is performed so as to form a first dummy gate layer and a second dummy gate layer 208, as illustrated in FIG. 3. The first sidewall spacer and the second sidewall spacer 216 may be formed by depositing nitride layers on the interface layers 212 and then performing reactive ion etching to the same, as illustrated in FIG. 4.

The source/drain regions 214, 217 may be formed by, depending on the desired transistor structure, implanting n-type or p-type dopants into the substrate 200. The source/drain regions 214 may be n-type doped Si:C, wherein the percentage of C is in the range of 0.2-2%. The source/drain regions 217 may be p-type doped SiGe, wherein the percentage of Ge is in the range of 20-70%. The source/drain regions 214, 217 may be formed by lithography, dopant implantation, diffusion and/or any other appropriate method. And the common process and steps for manufacturing a semiconductor are utilized for thermal annealing the device so as to activate the dopants in the source and drain regions 214, 217. The thermal annealing may be performed following the processes comprising rapid thermal annealing and spike annealing, which are known to those skilled in the art. Preferably, the spike annealing at a temperature in the range of 1000-1100° C. or laser annealing may be performed to activate the dopants in the source and drain regions 214, 217, as illustrated in FIG. 4.

Particularly, a metal silicide, such as NiPtSi, may be formed in the source regions and the drain regions, after the doping and annealing to the source regions and the drain regions of the NMOS and PMOS regions. For example, it may be formed by depositing NiPt in the range of about 3-12 nm on the substrate, then performing thermal annealing to the same at a temperature in the range of about 300-500° C., and then etching the un-reacted NiPt after annealing, so as to adjust the contact resistance of the contact hole that is formed sequentially.

With reference to FIGS. 5-6, an interlayer dielectric layer is formed on the substrate and between the first gate stack and the second gate stack. The interlayer dielectric layer comprise a nitride layer 220 having a thickness in the range of 10-30 nm and an oxide layer 222 having a thickness in the range 10-30 nm. The interlayer dielectric layer may be formed by depositing respectively the nitride layer 220 and the oxide layer 222, and then performing the chemical-mechanical planarization process to expose the upper surfaces of the first dummy gate layer and the second dummy gate layer.

The flow then goes to step c, the second dummy gate layer 208 of the PMOS region is removed to form a second truncation. The second gate stack is formed in the second truncation. The second gate stack comprises a second gate dielectric layer 226, a second metal gate layer 228 and a second stress layer 230, wherein the second stress layer 230 fills the space within the second metal gate layer 228. The second gate dielectric layer 226 and the second metal gate layer 228 cover the sidewall of the second truncation and the second interface layer 212, and the second stress layer 230 is made of a stress material with tensile stress.

With reference to FIG. 7, a layer of etching protection layer 224, for example an oxide layer such as silicon oxide with a thickness in the range of about 5-20 nm, is deposited on the device, then lithography is performed so as to form a mask protection layer (not shown in the Figure) on the NMOS region. And then etching is performed to remove the etching protection layer 224 on the PMOS region, so as to expose the PMOS region, and the mask protection layer on the NMOS region is then removed. The second dummy gate layer 208 is removed by such as RIE, so as to form an truncation. A second gate dielectric layer 226, a metal gate layer 228 and a stress layer 230 are formed in the truncation.

The second gate dielectric layer 226 may be a thermal oxide layer comprising silicon oxide, silicon nitride, such as silicon dioxide, and may also be a high-k dielectric, such as $HfO_2$, $TiO_2$, $ZrO_2$, $Al_2O_3$, with a thickness of preferably in the range of about 1-5 nm. The second metal gate layer 228 may be p-type metals, comprising, but not limited to, $MoN_x$, TiSiN, TiCN, TaAlC, TiAlN, TaN, $PtSi_x$, $Ni_3Si$, Pt, Ru, Ir, Mo, HfRu, $RuO_x$. Preferably, the work function of the metal gate layer 228 approaches the edge of the valence band of Si, for example, with a distance to the edge of the valence band of Si smaller than 0.2 eV, and having a thickness of preferably in the range of about 1-5 nm. The second stress layer 230 fills the space within the second metal gate layer 228, wherein the second stress layer 230 may comprise materials with tensile stress, such as TiAl, which may be formed by depositing Ti and Al in the space within the second metal gate layer 228, and performing thermal annealing to the same at a temperature in the range of about 300-500□ for about 1 to 20 seconds.

The flow then goes to step d: the first dummy gate layer of the NMOS region is removed to form a first truncation, so as to form a first gate stack in the first truncation. The first gate stack comprises a first gate dielectric layer, a first metal gate layer, and a first stress layer that fills the space within the first metal gate layer 234. The first gate dielectric layer and the first metal gate layer cover the sidewall of the first truncation and the first interface layer, and the first stress layer is made of a stress material with compressive stress.

With reference to FIG. 8, a layer of etching protection layer 224, for example, an oxide layer such as silicon oxide with a thickness of about 5-20 nm, is deposited on the device, and then lithography is performed so as to form a mask protection layer (not shown in the Figure) on the PMOS region. Then, etching is performed for removing the etching protection layer 224 on the NMOS region, so as to expose the NMOS region, and the mask protection layer on the PMOS region is removed subsequently. The first dummy gate layer 208 is removed by, such as RIE, so as to form an truncation. The first gate dielectric layer 232, the metal gate layer 234 and the stress layer 236 are formed in the truncation.

The first gate dielectric layer 232 may be a thermal oxide layer comprising silicon oxide, silicon nitride, such as silicon dioxide, and may also be a high-k dielectric, such as $HfO_2$, $TiO_2$, $ZrO_2$, and $La_2O_3$, preferably with a thickness in the range of about 1-5 nm. The first metal gate layer 234 may be of N-type metals, comprising, but not limited to, TaC, TiN, TaTbN, TaErN, TaYbN, TaSiN, HfSiN, MoSiN, $RuTa_x$, and $NiTa_x$. Preferably, the work function of the first metal gate layer 234 approaches the edge of the conduction band of Si, for example, with a distance smaller than 0.2 eV to the edge of the conduction band of Si, and having a thickness preferably in the range of about 1-5 nm. The first stress layer 236 fills the space within the first metal gate layer 234, wherein the first stress layer 236 may comprise materials with compressive stress, such as TiAl, which may be formed by sputtering TiAl.

Particularly, the second gate stack may be formed prior to the formation of the first gate stack, so as to avoid degradation of the material and the layer(s) in the first gate stack caused by the thermal annealing process applied to the second stress layer 230.

The flow then goes to step e; the first gate stack sidewall spacer 216 is removed so as to increase tensile stress in the channel region of the NMOS region; and the second gate stack sidewall spacer 216 is removed so as to increase compressive stress in the channel region of the PMOS region.

With reference to FIG. 9, the first sidewall spacer and the second sidewall spacer 216 may be selectively removed, for example, by RIE. Particularly, prior to the implementation of the reactive ion etching, an etching protection layer, such as an oxide layer 238, may be deposited on the surfaces of the first and the second gate stacks, so as to protect the first and the second gate stacks. In this way, the reactive ion etching may be performed to etch certain materials, such as the nitride layer, of the first sidewall spacer and the second sidewall spacer, while not etching the etching protection layer, such as the oxide layers 238, on the surfaces of the gate stacks.

Since the first gate stack of the NMOS region comprises the first stress layer 236 with compressive stress, such as a TiAl layer, when the first sidewall spacer 216 of the NMOS region is removed, the reaction force applied by the sidewall spacer 216 disappears accordingly, and then the TiAl layer with compressive stress is relaxed, such that the tensile stress in the channel region 215 of the NMOS region is increased accordingly, thence the mobility of electrons is improved and the performance of the device is enhanced. Likewise, when the second sidewall 216 of the PMOS region is removed, the reaction force applied by the sidewall spacer 216 disappears accordingly, thus the TiAl layer with tensile stress is relaxed, such that the compressive stress in the channel region 215 of the PMOS region is increased accordingly, thence the mobility of holes is improved and the performance of the device is enhanced.

The flow then goes to step f: a third stress structure with tensile stress is formed on the sidewall of the first gate stack of the NMOS region, and a fourth stress structure with compressive stress is formed on the sidewall of the second gate stack of the PMOS region.

For example, the third and the fourth stress structures 240 and 244 may be formed by the following method. With reference to FIG. 10, third stress sidewall spacer 240 having a thickness in the range of about 10-30 nm with tensile stress is deposited on the NMOS and PMOS regions to cover the entire device. That is, the third stress structure comprises portions covering the interlayer dielectric layer and the upper surfaces of the first and second gate stacks and located above the source region and the drain region of the NMOS and PMOS regions. Then, the etching protection layer 242 having a thickness in the range of about 5-15 nm is deposited on the third stress structure 240, wherein the etching protection layer 242 may be an oxide layer, such as silicon oxide. As shown in FIG. 11, lithography is performed so as to form a lithography protection layer on the NMOS region. And then etching such as RIE is performed to remove the etching protection layer 242 on the PMOS region while maintaining the etching protection layer 242 on the NMOS region. The remaining portions of the lithography protection layer on the NMOS region are then removed. As shown in FIG. 12, RIE is carried out to selectively remove portions of the third stress structure 240 which are not covered by the etching protection layer 242, such as the nitride layer with tensile stress, whereas selectively not etching the oxide layer on the gate stack and the metal silicide on the source region and the drain region.

The fourth stress structure 244 may be formed by the same method mentioned above. Namely, the fourth stress structure 244 having a thickness in the range of about 10-30 nm with compressive stress is deposited on the NMOS and PMOS regions to cover the entire device. That is, the fourth stress structure 244 comprises portions located above the source regions and the drain regions of the NMOS and PMOS regions and covering the interlayer dielectric layer and the upper surfaces of the first and second gate stacks, as illustrated in FIG. 13. Then, an etching protection layer 246 having a thickness in the range of about 5-15 nm is deposited on the fourth stress structure 244, wherein the etching protection layer 246 may be an oxide layer, such as silicon oxide. Then, lithography is performed so as to form a lithography protection layer on the PMOS region. Then etching such as RIE is performed to remove the etching protection layer 246 on the NMOS region while maintaining the etching protection layer 246 on the PMOS region, as illustrated in FIG. 14. The remaining portions of the lithography protection layer on the NMOS region are then removed. RIE is carried out to selectively remove the portions of the fourth stress structure 244 which are not covered by the etching protection layer 246, such as the nitride layer with tensile stress, whereas selectively not removing the oxide layer on the gate stack and the metal silicide over the source region and the drain region.

Alternatively, an etching stop layer, such as an oxide layer with a thickness in the range of about 3-5 nm (not shown in the Figure), may be deposited prior to the deposition of the third stress structure 240 as the etching stop layer when the third stress structure is etched. Alternatively, the chemical-mechanical planarization process may be performed prior to the formation of the sequential contact hole 248, so as to remove the overlapping portion between the third stress structure 240 and the fourth stress structure 244, as illustrated in FIG. 14.

The third stress structure 240 has the same function as the typical tensile stress cap layer, and may further increase the tensile stress in the channel region of the NMOS device, so as to improve the mobility of electrons and enhance the performance of the device. Likewise, the fourth stress structure 244 has the same function as the typical compressive stress cap layer, and may further increase the compressive stress in the channel region of the PMOS device, so as to improve the mobility of holes and enhance the performance of the device.

The chemical-mechanical planarization process (CMP) is performed for planarizing the surface of the semiconductor substrate.

Then, alternatively, the method may further comprise a step of forming contact holes 248 in the interlayer dielectric layer on the source regions and the drain regions of the NMOS and PMOS regions. The lithography protection layer may be formed by lithography on the upper surface of the device and above the source regions and the drain regions of the NMOS and PMOS regions. RIE is performed to form the contact holes 248, which may be provided in the range of about 10-50 nm away from the gate stacks of the NMOS and PMOS regions or the third/fourth sidewall spacer. A TiN layer and a W contact material are formed within the contact hole.

The structure of the CMOS device in the present invention and the method of manufacturing the same have been described in detail according to the embodiment of the present invention above. However, a MOSFET device of particular type, such as N-type field effect transistor device or P-type field effect transistor device, may be required in some applications in practice. For example, the N-type field effect transistor may be used in NAND gate circuitry.

The embodiments of the present invention may provide specific MOSFETs and the method of manufacturing the same, so as to provide a MOSFET device with improved carrier mobility and a method of manufacturing the same for the particular applications. These solutions may be readily appreciated by a person of ordinary skill in the art from the disclosure of the present invention above.

Hereinafter, with reference to the drawings, the structure of an exemplified N-type field effect transistor device and the method for manufacturing the same are described, wherein the same reference sign denotes the same or similar device or step. The following description about the device and the method of manufacturing the same are also applicable for the P-type field effect transistor device and the method of manufacturing the same, unless stated otherwise.

Figure 23:
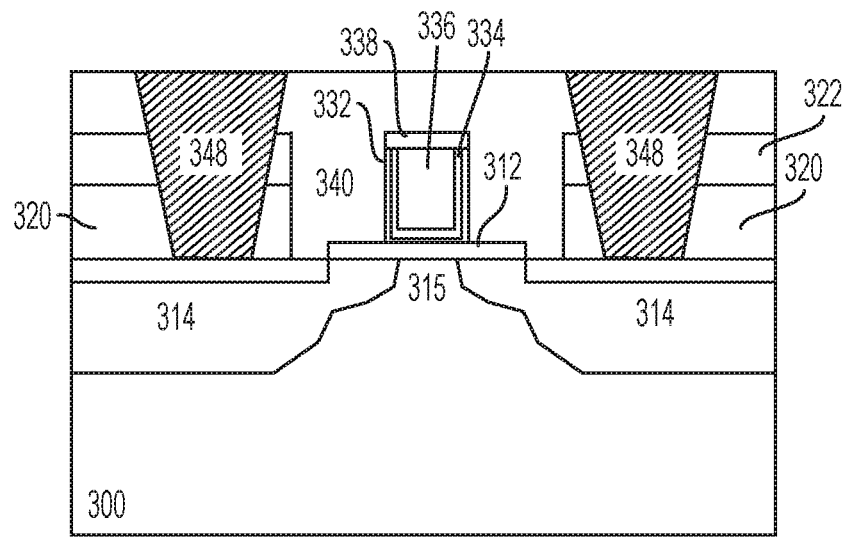

With reference to FIG. 23, the field effect transistor comprises a substrate 300. In the present embodiment, the substrate 300 comprises a crystalline silicon substrate (for example a wafer). According to the design specifications known in the prior art (for example, a p-type substrate or an n-type substrate), the substrate 300 may be of various doping configurations. Other examples of the substrate 300 may also comprise other common semiconductor, for example germanium and diamond. Alternatively, the substrate 300 may comprise compound semiconductors, such as SiC, GaAs, InAs or InP. Additionally, the substrate 300 may comprise an epitaxial layer, may be under stress to enhance performance, and/or may comprise a SOI (silicon on insulator) structure.

The device further comprises source and drain regions 314 in the substrate, and a channel region 315 between the source region and the drain region. As for an NMOS device, the source/drain regions 314 may be n-type doped Si:C, wherein the percentage of C is in the range of 0.2-2%. As for a PMOS device, the source/drain regions 314 may be p-type doped SiGe, wherein the percentage of Ge is in the range of 20-70%. The source/drain regions 314 may be formed by lithography, dopant implantation, diffusion and/or any other appropriate method. The present invention adopts replacement gate process, thus the source/drain regions 314 are formed prior to the formation of the gate stacks, and the common process and steps for manufacturing a semiconductor are utilized for thermal annealing the device, so as to activate the dopants in the source and drain regions 314. The thermal annealing may be performed following the processes comprising rapid thermal annealing and spike annealing, which are known to those skilled in the art.

The device further comprises a gate stack formed on the substrate 300, wherein the gate stack comprises a gate dielectric layer 332, a metal gate layer 334 and a stress layer 336 with stress on the gate dielectric layer 332. The stress layer 336 fills the space within the metal gate layer 334.

As for an NMOS device, the gate dielectric layer 332 may be a thermal oxide layer comprising silicon oxide, silicon nitride, such as silicon dioxide, and may also be a high-k dielectric, such as $HfO_2$, $TiO_2$, $ZrO_2$, and $La_2O_3$, with a thickness of preferably in the range of about 1-5 nm. The metal gate layer 334 may be of n-type metals, comprising, but not limited to, TaC, TiN, TaTbN, TaErN, TaYbN, TaSiN, HfSiN, MoSiN, $RuTa_x$, $NiTa_x$. Preferably, the work function of the metal gate layer 334 approaches the edge of the conduction band of Si, for example, having a distance to the edge of conduction band of Si smaller than 0.2 eV, and with a thickness of preferably in the range of about 1-5 nm. The stress layer 336 fills the space within the metal gate layer 334, wherein the stress layer 336 may comprise materials with compressive stress, such as TiAl, which may be formed by sputtering TiAl.

As for a PMOS device, the gate dielectric layer 332 may be a thermal oxide layer comprising silicon oxide, silicon nitride, such as silicon dioxide, and also may be a high-k dielectric, such as $HfO_2$, $TiO_2$, $ZrO_2$, $Al_2O_3$, with a thickness of preferably in the range of 1-5 nm. The metal gate layer 334 may be p-type metals, comprising, but not limited to, $MoN_x$, TiSiN, TiCN, TaAlC, TiAlN, TaN, $PtSi_x$, $Ni_3Si$, Pt, Ru, Ir, Mo, HfRu, $RuO_x$. Preferably, the work function of the metal gate layer 334 approaches the edge of the valence band of Si, for example, having a distance to the edge of the valence band of Si smaller than 0.2 eV, and with a thickness of preferably in the range of about 1-5 nm. The stress layer 336 fills the space within the metal gate layer 334, wherein the stress layer 336 may comprise materials with tensile stress, for example, TiAl with tensile stress, which may be formed by depositing Ti and Al in the space within the metal gate layer, and then performing thermal annealing to the same at a temperature in the range of about 300-500☐ for about 1 to 20 seconds.

Figure 17:
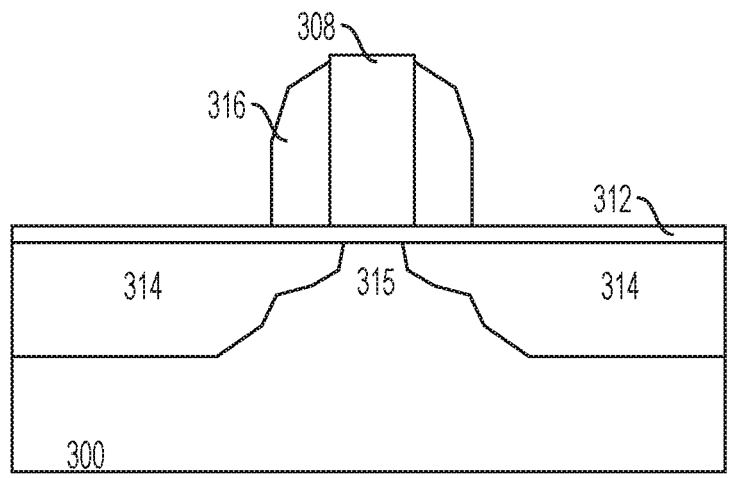
FIGS. 17 to 24 are structural diagrams illustrating the manufacturing of different stages of the field effect transistor device according to another embodiment of the present invention.

With reference to FIG. 17, the gate stack is formed by forming firstly, on the substrate, a dummy gate layer 308, such as polysilicon, and a sidewall spacer 316, for example, a nitride, such as silicon nitride, then removing the dummy gate layer 308 to form an truncation, and forming the gate dielectric layer 332, the metal gate layer 334 and the stress layer 336 in the truncation.

The dummy gate layer 308 and the sidewall spacer 316 may be formed by, for example, depositing an interface layer 312 with a thickness in the range of 1-3 nm on the surface of the substrate, for example, an oxide layer, such as $SiO_2$, then depositing a dummy gate layer 308 on the interface layer, such as polysilicon with a thickness in the range of about 50-120 nm, and then depositing an etching protection layer and performing lithography to the gate. Whereby, the sidewall spacer 316 may be formed by depositing a nitride layer on the interface layer 312, and then performing reactive ion etching to the same. The interface layer 312 may provide etching protection both to the source and drain regions of the device and the extension regions thereof.

Particularly, the device further comprises an interlayer dielectric layer on the substrate, as illustrated in FIGS. 5-6. The interlayer dielectric comprises a nitride layer 320 with a thickness in the range of about 10-30 nm and an oxide layer 322 with a thickness in the range of about 10-30 nm. The interlayer dielectric layer may be formed by disposing respectively (CVD or PECVD) the nitride layer 320 and the oxide layer 322, and then performing the chemical-mechanical planarization process to the same, so as to expose the upper surface of the dummy gate layer.

As for an NMOS device, the device further comprises a stress structure 340 with tensile stress formed on the sidewall of the gate stack. And the stress structure 340 is made of a material with opposite stress to the stress layer 336, i.e. a material with tensile stress, for example, a tensile stressed nitride layer, such as $Si_3N_4$.

As for a PMOS device, the device further comprises a stress structure 340 with compressive stress formed on the sidewall of the gate stack. And the stress structure 340 is made of a material with opposite stress to the stress layer 336, i.e. a material with compressive stress, for example, a compressive stressed nitride layer, such as, $Si_3N_4$.

Figure 20:
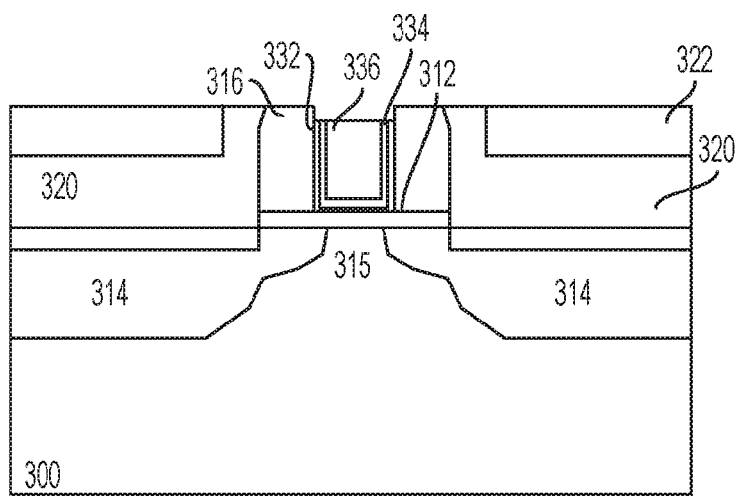
Figure 21:
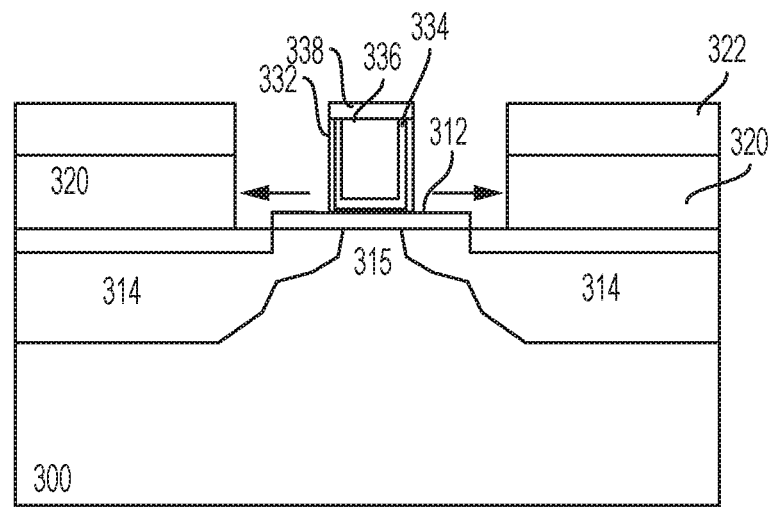
Figure 22:
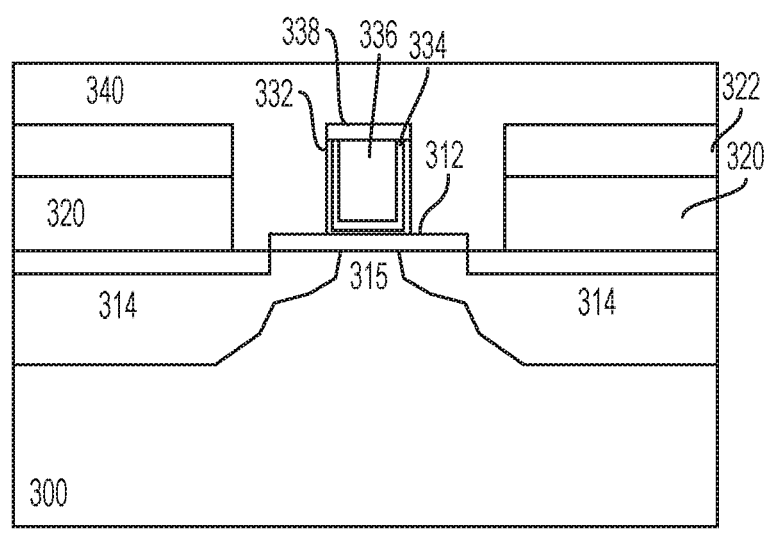

With reference to FIGS. 20-22, the stress structures 340 are formed by depositing respectively the material with tensile stress and the material with compressive stress on the gate stack after removing the sidewall spacers 316. The sidewall spacers 316 may be removed by, for example, RIE, as shown in FIG. 21. Particularly, prior to performing RIE, an etching protection layer, such as an oxide layer 338, may be deposited on the surface of the gate stack, so as to protect the gate stack.

As for an NMOS device, since the gate stack comprises the stress layer 336 with compressive stress, such as the TiAl layer, when the sidewall spacer 316 is removed, the reaction force applied by the sidewall spacer 316 disappears accordingly, and the TiAl layer with compressive stress is relaxed, such that the tensile stress in the channel region 315 of the NMOS region is increased accordingly, thence the mobility of electrons is improved, and the performance of the device is enhanced.

As for a PMOS device, when the sidewall spacer 316 is removed, the reaction force applied by the sidewall spacer 316 disappears accordingly, and thus the TiAl layer with tensile stress is relaxed, such that the compressive stress in the channel region 315 of the PMOS region is increased accordingly, thence the mobility of holes is improved, and the performance of the device is enhanced.

Particularly, the stress structure further comprises portions that covers the interlayer dielectric layer and the gate stack.

As for an NMOS device, the stress structure 340 has the same function as the typical tensile stress cap, and may further increase the tensile stress in the channel region of the NMOS device, so as to improve the mobility of electrons, and enhance the performance of the device. Likewise, as for a PMOS device, the stress structure 340 has the same function as the typical compressive stress cap, and may further increase compressive stress in the channel region of the PMOS device, so as to improve the mobility of holes, and enhance the performance of the device.

The chemical-mechanical planarization process (CMP) is performed for planarizing the surface of the semiconductor substrate.

The device may further comprise a contact hole 348 formed in the interlayer dielectric layer on the source region and the drain region. The upper surface of the device may be covered, and lithography is carried out on the source region and the drain region, so as to form a lithography protection layer. RIE is performed to form the contact hole 348, which may be provided in the range of about 10-50 nm away from the gate stack or from the sidewall spacer. A TiN layer and a W contact material are formed within the contact hole.

Particularly, a metal silicide, such as NiPtSi or $CoSi_2$, may be formed in the source region and the drain region, after doping and annealing to the source region and the drain region. For example, it may be formed by depositing NiPt in the range of about 3-12 nm on the substrate, then performing thermal annealing to the same at a temperature in the range of about 300-5000, and then etching the un-reacted NiPt after annealing, so as to adjust the contact resistance of the contact hole that is formed subsequently.

The structure of the field effect transistor device with improved carrier mobility formed by the replacement gate process have been described in detail.

Figure 25:
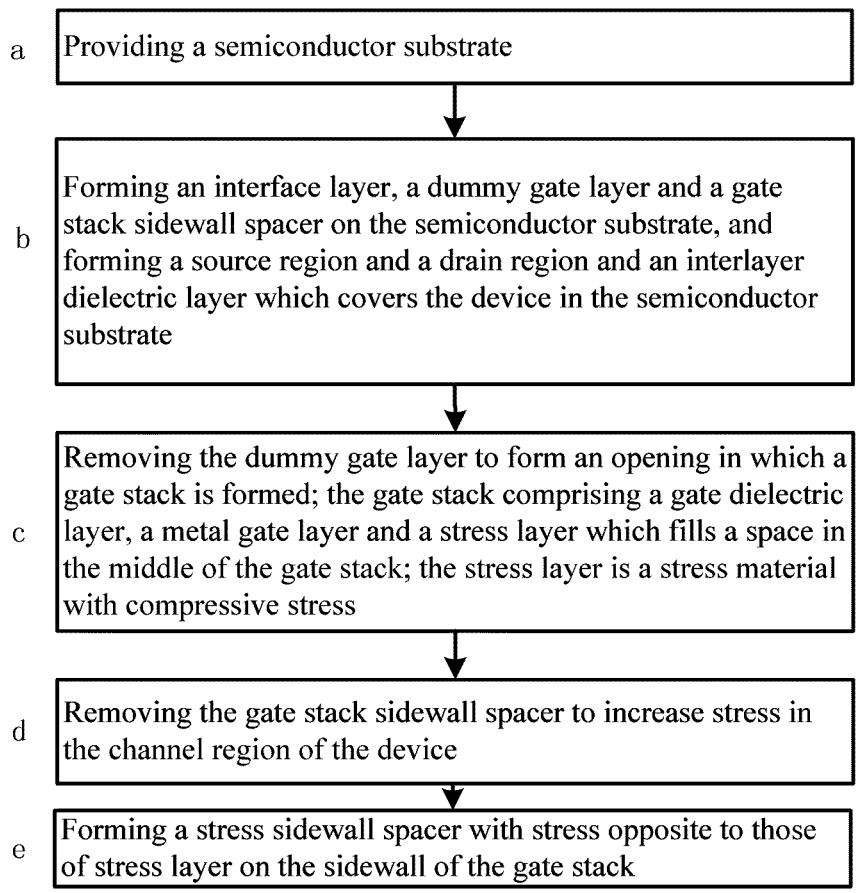
FIG. 25 is a flowchart illustrating a method of manufacturing the field effect transistor according to another embodiment of the present invention.

Hereinafter, with reference to FIG. 25, the method of manufacturing the field effect transistor device of the present invention is described.

In step a, a semiconductor substrate is provided.

With reference to FIG. 17, the field effect transistor comprises a substrate 300. In the present embodiment, the substrate 300 comprises a crystalline silicon substrate (for example a wafer). According to the design specifications known in the prior art (for example, a p-type substrate or an n-type substrate), the substrate 300 may be of various doping configurations. Other examples of the substrate 300 may also comprise other basic semiconductors, for example, germanium and diamond. Alternatively, the substrate 300 may comprise compound semiconductors, such as SiC, GaAs, InAs or InP. Additionally, the substrate 300 may comprise an epitaxial layer, may be under stress to enhance performance, and/or may comprise a SOI (silicon on insulator) structure.

The flow then goes to b, an interface layer, a dummy gate layer and a gate stack sidewall spacer are formed on the semiconductor substrate, and a source region and a drain region and an interlayer dielectric layer covering the device are formed in the semiconductor substrate.

The interface layer 312, the dummy gate layer 308 and the gate stack sidewall spacer 316 are formed on the semiconductor substrate 300, and a source region and a drain region 314, an interlayer dielectric layer covering the device and a channel region 215 between the source region and the drain region are formed in the semiconductor substrate 300.

With reference to FIG. 17, the interface layer 312, the dummy gate layer 308 and the sidewall spacer 316 may be formed by, for example, depositing an interface layer 312 having a thickness in the range of about 1-3 nm on the surface of the substrate, wherein the interface layer may be, for example, an oxide layer, such as $SiO_2$. The interface layer 312 may provide etching protection both to the source and drain of the device and the extension regions thereof. Then dummy gate layer 308, such as polysilicon with a thickness of about 50-120 nm, is deposited on the interface layer, then an etching protection layer is deposited, and then lithography is performed to the gate so as to form the dummy gate layer 308.

The source/drain regions 314 may be formed by, depending on the desired transistor structure, implanting n-type or p-type dopants into the substrate 300. As for an NMOS device, the source/drain regions 314 may be n-type doped Si:C, wherein the percentage of C is in the range of 0.2-2%. As for a PMOS device, the source/drain regions 314 may be p-type doped SiGe, wherein percentage of Ge is in the range of about 20-70%. The source/drain regions 314 may be formed by lithography, dopant implantation, diffusion and/or any other appropriate method. Since the present invention uses replacement gate process, the source/drain regions 314 are formed prior to the formation of the gate stacks. The typical processes and steps for manufacturing a semiconductor are also applicable for performing thermal annealing to the device, so as to activate the dopants in the source and drain regions 314. The thermal annealing may comprise rapid thermal annealing and spike annealing, which are known to those skilled in the art. Preferably, the spike annealing at a temperature in the range of 1000-1100□ or laser annealing may be performed to activate the dopants in the source and the drain regions 314.

Particularly, a metal silicide, such as NiPtSi, may be formed in the source region and the drain region, after doping and annealing to the source region and the drain region. For example, it may be formed by depositing NiPt with a thickness in the range of about 3-12 nm on the substrate, then performing thermal annealing at a temperature in the range of about 300-500□, and then etching the un-reacted NiPt after annealing, so as to adjust the contact resistance of the contact hole that is formed subsequently.

Figure 18:
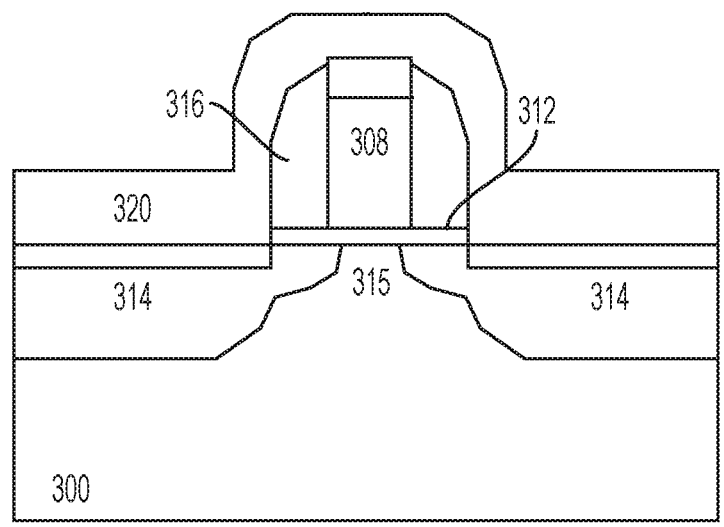
Figure 19:
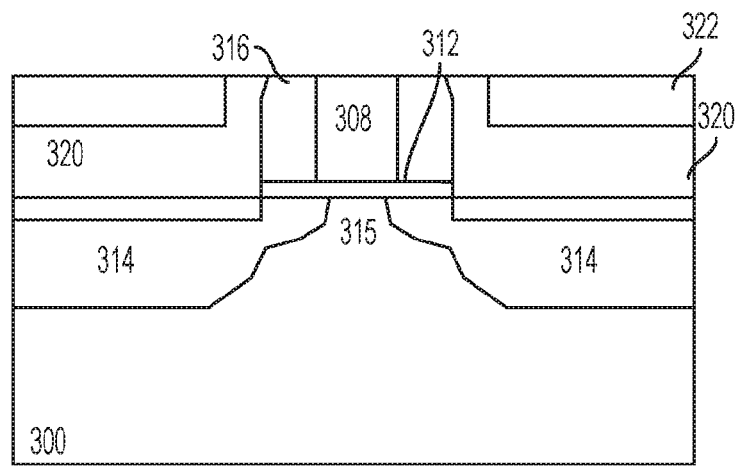

With reference to FIGS. 18-19, an interlayer dielectric layer may be formed on the substrate. The interlayer dielectric comprises a nitride layer 320 with a thickness in the range of 10-30 nm and an oxide layer 322 with a thickness in the range of 10-30 nm. The interlayer dielectric layer may be formed by depositing respectively the nitride layer 320 and the oxide layer 322, and then performing the chemical-mechanical planarization process to expose the upper surface of the dummy gate layer.

The flow then goes to step c; the dummy gate layer 308 is removed to form an truncation, wherein a gate stack is formed within the truncation. The gate stack comprises a gate dielectric layer 332, a metal gate layer 334 and a stress layer 336 that fills the space within the metal gate layer 334. The stress layer 336 is made of stress materials with stress.

The gate dielectric layer 332 and the metal gate layer 334 may cover the sidewall of the truncation, and the interface layer 312. As for an NMOS device, the gate dielectric layer 332 may be a thermal oxide layer comprising silicon oxide, silicon nitride, such as silicon dioxide, and may also be a high-k dielectric, such as $HfO_2$, $TiO_2$, $ZrO_2$, and $La_2O_3$, with a thickness of preferably in the range of about 1-5 nm. The metal gate layer 334 may be n-type metals comprising, but not limited to, TaC, TiN, TaTbN, TaErN, TaYbN, TaSiN, HfSiN, MoSiN, $RuTa_x$, and $NiTa_x$. Preferably, the work function of the metal gate layer 334 approaches the edge of the conduction band of Si, for example, having a distance to the edge of the conduction band of Si smaller than 0.2 eV, and with a thickness of preferably in the range of about 1-5 nm. The stress layer 336 fills the space within the metal gate layer 334, and the stress layer 336 may comprise materials with compressive stress, such as TiAl, which may be formed by sputtering TiAl.

As for a PMOS device, the gate dielectric layer 332 may be a thermal oxide layer comprising silicon oxide, silicon nitride, such as silicon dioxide, and may also be a high-k dielectric, such as $HfO_2$, $TiO_2$, $ZrO_2$, and $Al_2O_3$, with a thickness of preferably in the range of 1-5 nm. The metal gate layer 334 may be p-type metals comprising, but not limited to, $MoN_x$, TiSiN, TiCN, TaAlC, TiAlN, TaN, $PtSi_x$, $Ni_3Si$, Pt, Ru, Ir, Mo, HfRu, and $RuO_x$. Preferably, the work function of the metal gate layer 334 approaches the edge of the valence band of Si, for example, having a distance to the edge of the valence band of Si smaller than 0.2 eV, and with a thickness of preferably in the range of 1-5 nm. The stress layer 336 fills the space within the metal gate layer 334, and the stress layer 336 may comprises materials with tensile stress, for example, TiAl with tensile stress, which may be formed by depositing Ti and Al in the space within the metal gate layer 334, and then performing thermal annealing to the same at a temperature in the range of about 300-500□ for about 1 to 20 seconds.

The flow then goes to step d: the sidewall spacer 316 of the gate stack is removed, so as to increase stress in the channel region of the device.

With reference to FIG. 21, the sidewall spacer 316 may be selectively removed by RIE. Particularly, prior to the implementation of reactive ion etching, an etching protection layer, such as an oxide layer 338, may be deposited on the surface of the gate stack, so as to protect the gate stack. In this way, the reactive ion etching may be performed to etch the material of the sidewall spacer, such as the nitride layer, while not etching the etching protection layer on the surface of the gate stack, such as the oxide layer 338.

As for an NMOS device, since the gate stack comprises the stress layer 336, such as the TiAl layer with compressive stress, when the sidewall spacer 316 is removed, the reaction force applied by the sidewall spacer 316 disappears accordingly, and the TiAl layer with compressive stress is relaxed, such that the tensile stress in the channel region 315 of the NMOS region is increased, thence the mobility of electrons is improved, and the performance of the device is enhanced, as illustrated in FIG. 21.

Figure 24:
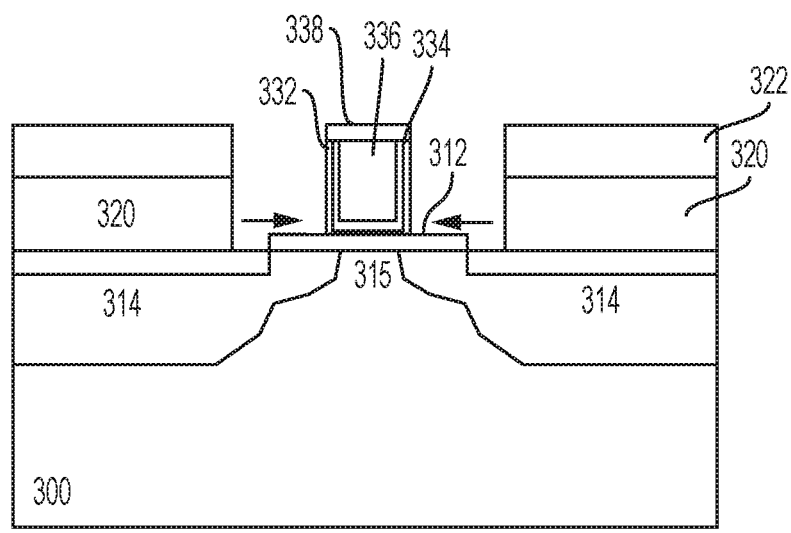

As for a PMOS device, when the sidewall spacer 316 is removed, the reaction force applied by the sidewall spacer 316 disappears accordingly, and thus the TiAl layer with tensile stress is relaxed, such that the compressive stress in the channel region 315 of the PMOS region is increased accordingly, thence the mobility of holes is improved, and the performance of the device is enhanced, as illustrated in FIG. 24.

The flow then goes to step e: a stress structure with opposite stress to the stress layer is formed on the sidewall of the gate stack.

As for an NMOS device, a stress structure 340 with tensile stress is formed on the sidewall of the gate stack. The stress structure 340 is made of materials with stress opposite to the stress layer 336, i.e. a material with tensile stress, for example a tensile stressed nitride layer, such as $Si_3N_4$.

As for a PMOS device, a stress structure 340 with compressive stress is formed on the sidewall of the gate stack. The stress structure 340 is made of materials with stress opposite to the stress layer 336, i.e., a material with compressive stress, for example, a compressive stressed nitride layer, such as $Si_3N_4$.

Particularly, the stress structure further comprises portions that cover the interlayer dielectric layer and the gate stack.

As for an NMOS device, the stress structure 340 has the same function as the typical tensile stress cap, and may further increase the tensile stress in the channel region of the NMOS device, so as to improve the mobility of electrons, and enhance the performance of the device. Likewise, as for a PMOS device, the stress structure 340 has the same function as the typical compressive stress cap does, and may further increase the compressive stress in the channel region of the PMOS device, so as to improve the mobility of holes, and enhance the performance of the device.

The Chemical-Mechanical Planarization process (CMP) is performed for planarizing the surface of the semiconductor substrate.

Alternatively, the method may further comprise a step for forming a contact hole 348 in the interlayer dielectric layer. The upper surface of the device may be covered, and lithography is carried out on the source region and the drain region, so as to form a lithography protection layer. RIE is performed to form the contact hole 348, which may be provided in a range from about 10 to 50 nm away from the gate stack or from the sidewall spacer. A TiN layer and a contact material of W are formed within the contact hole.

The field effect transistor device of the present invention and the method of manufacturing the same have been described in detail according to the embodiments of the present invention. The present invention increases both tensile stress in the channel region of NMOS device and compressive stress in the channel region of PMOS device by forming respectively a first stress layer with compressive stress in the space within the first metal gate layer of the NMOS device, and a second stress layer with tensile stress within the gate stack of the PMOS device, using replacement gate process. After the formation of the stress layers, removing the sidewall spacers of the gate stacks of the PMOS and NMOS devices by the replacement gate process, so as to release the stress in the channel regions. In particular, stress layers with opposite stress may be formed on the sidewall of the gate stacks of the NMOS device and PMOS device and on a portion of the source regions and the drain regions, thereby further increasing both tensile stress of the NMOS device and compressive stress of the PMOS device. Namely, a third stress structure with tensile stress may be formed for an NMOS device, and a fourth stress structure with compressive stress may be formed for a PMOS device. According to the devices and the methods for manufacturing the same as proposed in the present invention, the performance of the device may be well enhanced by applying stress to the channel(s) of the NMOS device and/or the PMOS device to the maximum extent, with the continuous scaling of the devices.

Although the embodiments and their advantages have been described in detailed, it is readily apparent to those having ordinary skill in the art in the art that various alternations, substitutions and modifications may be made to the embodiments without departing from the spirit of the present invention and the scope as defined by the appended claims. For other examples, it may be easily recognized by a person of ordinary skill in the art that the sequence of the process steps may be changed without departing from the scope of the present invention.

In addition, the scope to which of the present invention is applied is not limited to the process, mechanism, manufacture, material composition, means, methods and steps described in the specific embodiments in the specification. A person of ordinary skill in the art would readily appreciate from the disclosure of the present invention that the process, mechanism, fabrication, material composition, means, methods and steps currently exiting or to be developed in future, which perform substantially the same functions or achieve substantially the same as that in the corresponding embodiments described in the present invention, may be applied according to the present invention. Therefore, it is intended that the scope of the appended claims of the present invention comprises these process, mechanism, manufacture, material composition, means, methods and steps.

What is claimed is:

1. A replacement-gate field effect transistor device with improved carrier mobility, comprising:
   a semiconductor substrate with NMOS and PMOS regions, wherein the NMOS region and the PMOS region are isolated from each other;
   a source region and a drain region belonging to the NMOS region and a source region and a drain region belonging to the PMOS region formed in the semiconductor substrate;
   an interlayer dielectric layer on a semiconductor layer, and a first truncation and a second truncation belonging respectively to the NMOS region and the PMOS region and being formed in the interlayer dielectric layer;
   a first gate stack formed within the first truncation and a second gate stack formed in the second truncation, wherein the first gate stack comprises: a first gate dielectric layer; and a first metal gate layer and a first stress layer with compressive stress on the first gate dielectric layer, wherein the first stress layer fills a space within the first metal gate layer; and the second gate stack comprises: a second gate dielectric layer; and a second metal gate layer and a second stress layer with tensile stress on the second gate dielectric layer, wherein the second stress layer fills a space within the second metal gate layer;
a third stress structure with tensile stress on a sidewall of the first gate stack; and
a fourth stress structure with compressive stress on a sidewall of the second gate stack,
wherein the third stress structure is in direct contact with the first gate dielectric layer which is in direct contact with the first metal gate layer, and a portion of an upper surface of the third stress structure directly above the first gate stack is coplanar with another portion of the upper surface of the third stress structure directly above the source region and the drain region belonging to the NMOS region,
wherein the fourth stress structure is in direct contact with the second gate dielectric layer which is in direct contact with the second metal gate layer, and a portion of an upper surface of the fourth stress structure directly above the second gate stack is coplanar with another portion of the upper surface of the fourth stress structure directly above the source region and the drain region belonging to the PMOS region,
wherein the third stress structure further comprises portions covering a top of the interlayer dielectric layer, and the fourth stress structure further comprises portions covering a top of the interlayer dielectric layer.

2. The field effect transistor device according to claim 1, wherein the third stress structure is formed after the formation of the first gate stack, and the fourth stress structure is formed after the formation of the second gate stack.

3. The field effect transistor device according to claim 1, wherein the first stress layer in the first gate stack comprises TiAl with compressive stress.

4. The field effect transistor device according to claim 3, wherein TiAl with compressive stress is formed by sputtering TiAl.

5. The field effect transistor device according to claim 1, wherein the second stress layer in the second gate stack comprises TiAl with tensile stress.

6. The field effect transistor device according to claim 5, wherein the TiAl with tensile stress is formed by depositing Ti and Al in the space within the second metal gate layer and performing thermal annealing to the same.

7. The field effect transistor device according to claim 6, wherein the thermal annealing is performed at a temperature in the range of 300° C.-500° C.

8. The field effect transistor device according to claim 1, wherein the third stress structure comprises a nitride with tensile stress.

9. The field effect transistor device according to claim 1, wherein the fourth stress structure comprises a nitride with compressive stress.

10. The field effect transistor device according to claim 1, wherein the interlayer dielectric layer comprises a nitride layer and an oxide layer.

11. The field effect transistor device according to claim 1, wherein the third stress structure further comprises portions being located above the source region and the drain region of the NMOS region and covering the first gate stack, and the fourth stress structure further comprises portions being located above the source region and the drain region of the PMOS region and covering the second gate stack.

12. The field effect transistor device according to claim 1, further comprising a metal silicide formed on a surface of the semiconductor substrate above the source regions and the drain regions of the NMOS region and the PMOS region.

13. The field effect transistor device according to claim 12, further comprising contact holes formed in the interlayer dielectric layer above the source regions and the drain regions of the NMOS region and the PMOS region.

14. The field effect transistor device according to claim 13, further comprising a TiN layer and a W contact material formed in the contact holes.

15. A replacement-gate N-type field effect transistor device with improved carrier mobility, comprising:
a semiconductor substrate;
a source region and a drain region formed in the semiconductor substrate;
an interlayer dielectric layer located on the semiconductor substrate, and an truncation formed in the interlayer dielectric layer;
a gate stack formed within the truncation, wherein the gate stack comprises: a gate dielectric layer; and a metal gate layer and a stress layer with compressive stress on the gate dielectric layer, wherein the stress layer fills a space within the metal gate layer; and
a stress structure with tensile stress on a sidewall of the gate stack,
wherein the stress structure is in direct contact with the gate dielectric layer which is in direct contact with the metal gate layer, and a portion of an upper surface of the stress structure directly above the gate stack is coplanar with another portion of the upper surface of the stress structure directly above the source region and the drain region, and
wherein the stress structure further comprises portions covering a top of the interlayer dielectric layer.

16. The N-type field effect transistor device according to claim 15, wherein the stress structure is formed after the formation of the gate stack.

17. The N-type field effect transistor device according to claim 16, wherein the stress layer in the gate stack comprises TiAl with compressive stress.

18. The N-type field effect transistor device according to claim 17, wherein the TiAl with compressive stress is formed by sputtering TiAl.

19. The N-type field effect transistor device according to claim 15, wherein the stress structure comprises a nitride with tensile stress.

20. The N-type field effect transistor device according to claim 15, wherein the stress structure further comprises portions covering the gate stack.

21. The N-type field effect transistor device according to claim 15, further comprising a metal silicide formed on a surface of the semiconductor substrate above the source region and the drain region.

22. The N-type field effect transistor device according to claim 21, further comprising contact holes formed in the interlayer dielectric layer above the source region and the drain region.

23. The N-type field effect transistor device according to claim 22, further comprising a TiN layer and a W contact material formed in the contact holes.

24. A replacement-gate P-type field effect transistor device with improved carrier mobility, comprising:
a semiconductor substrate;
a source region and a drain region formed in the semiconductor substrate;
an interlayer dielectric layer on the semiconductor substrate and an truncation formed in the interlayer dielectric layer;
a gate stack formed within the truncation, wherein the gate stack comprises: a gate dielectric layer; and a metal gate layer and a stress layer with tensile stress on the gate dielectric layer, wherein the stress layer fills a space within the metal gate layer; and a stress structure with compressive stress on a sidewall of the gate stack, wherein the stress structure is in direct contact with the gate dielectric layer which is in direct contact with the metal gate layer, and a portion of an upper surface of the stress structure directly above the gate stack is coplanar with another portion of the upper surface of the stress structure directly above the source region and the drain region, and wherein the stress structure further comprises portions covering a top of the interlayer dielectric layer.

25. The P-type field effect transistor device according to claim 24, wherein the stress structure is formed after the formation of the gate stack.

26. The P-type field effect transistor device according to claim 25, wherein the stress layer in the gate stack comprises TiAl with tensile stress.

27. The P-type field effect transistor device according to claim 26, wherein the TiAl with tensile stress is formed by depositing Ti and Al in the space within the metal gate layer and performing thermal annealing to the same.

28. The P-type field effect transistor device according to claim 27, wherein the thermal annealing is performed at a temperature in the range of 300-500° C.

29. The P-type field effect transistor device according to claim 24, wherein the stress structure comprises a nitride with compressive stress.

30. The P-type field effect transistor device according to claim 24, wherein the stress structure further comprises portions covering the gate stack.

31. The P-type field effect transistor device according to claim 24, further comprising a metal silicide formed on a surface of the semiconductor substrate above the source region and the drain region.

32. The P-type field effect transistor device according to claim 31, further comprising contact holes formed in the interlayer dielectric layer above the source region and the drain region.

33. The P-type field effect transistor device according to claim 32, further comprising a TiN layer and a W contact material formed in the contact holes.

* * * * *